(12) United States Patent
Sato et al.

(10) Patent No.: US 6,901,938 B2
(45) Date of Patent: Jun. 7, 2005

(54) SUBSTRATE CLEANING APPARATUS (75) Inventors: Masanobu Sato, Kyoto (JP); Sadao Hirae, Kyoto (JP); Shuichi Yasuda, Kyoto (JP); Kenya Morinishi, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 0 days.

(21) Appl. No.: 10/699,671

(22) Filed: Nov. 4, 2003

(65) Prior Publication Data
US 2004/0089328 A1 May 13, 2004

Related U.S. Application Data (62) Division of application No. 09/987,270, filed on Nov. 14, 2001, now Pat. No. 6,705,331.

(30) Foreign Application Priority Data
Nov. 20, 2000 (JP) ..................................... P2000-352076

(51) Int. Cl.$^7$ ................................................. B08B 3/02
(52) U.S. Cl. ................. 134/99.1; 134/100.1; 134/102.1; 134/102.3; 134/181; 134/902
(58) Field of Search .............................. 134/94.1, 95.3, 134/99.1, 100.1, 102.1, 102.2, 103.2, 902, 181

(56) References Cited

U.S. PATENT DOCUMENTS

| | | | |
|---|---|---|---|
| 2,387,193 A | 10/1945 | Swenarton | |
| 3,012,921 A | 12/1961 | Vaughn | |
| 3,990,462 A * | 11/1976 | Elftmann et al. | ........ 134/102.1 |
| 4,787,404 A | 11/1988 | Klosterman et al. | |
| 4,801,335 A | 1/1989 | Burkman et al. | |
| 4,982,753 A * | 1/1991 | Grebinski et al. | ......... 134/95.3 |
| 5,062,898 A * | 11/1991 | McDermott et al. | ............ 134/7 |
| 5,372,652 A * | 12/1994 | Srikrishnan et al. | ........... 134/7 |
| 5,555,902 A * | 9/1996 | Menon | ........................ 134/199 |
| 5,792,275 A * | 8/1998 | Natzle et al. | ................... 134/7 |
| 5,887,605 A * | 3/1999 | Lee et al. | ................. 134/102.2 |
| 5,918,817 A | 7/1999 | Kanno et al. | |
| 5,934,566 A * | 8/1999 | Kanno et al. | ............... 239/398 |
| 6,247,479 B1 * | 6/2001 | Taniyama et al. | .......... 134/95.2 |
| 6,270,584 B1 | 8/2001 | Ferrell et al. | |
| 6,343,609 B1 | 2/2002 | Kim | |
| 6,383,331 B1 * | 5/2002 | Sumnitsch | ................... 118/302 |
| 6,386,466 B1 * | 5/2002 | Ozawa et al. | ............... 239/433 |
| 2002/0035762 A1 * | 3/2002 | Okuda et al. | ................... 15/77 |
| 2002/0062840 A1 * | 5/2002 | Verhaverbeke et al. | ...... 134/1.3 |

FOREIGN PATENT DOCUMENTS

| | | |
|---|---|---|
| JP | 52-62964 | 5/1977 |
| JP | 64-19730 | 1/1989 |
| JP | 3-131026 | 6/1991 |
| JP | 3-286517 | 12/1991 |
| JP | 5-74752 | 3/1993 |
| JP | 8-318181 | 12/1996 |
| JP | 10-156229 | 6/1998 |
| JP | 2003-59880 | 3/2003 |

* cited by examiner

Primary Examiner—Frankie L. Stinson
(74) Attorney, Agent, or Firm—McDermott Will & Emery LLP (57) ABSTRACT

The substrate processing apparatus is provided with a gas-liquid mixing nozzle for generating a gas-liquid mixture by mixing a liquid and a pressurized gas, to discharge the gas-liquid mixture to a substrate at high speeds. The mixture process is conducted in an open space out of the nozzle, and change in the supply pressure of the gas does not affect the supply of the liquid. The reaction products which having been generated on the substrate in etching process is removed at high speeds with the flow of the gas-liquid mixture, whereby the quality of the process is improved.

14 Claims, 7 Drawing Sheets

FIG. 7

SUBSTRATE CLEANING APPARATUS

This application is a divisional of application Ser. No. 09/987,270, filed Nov. 14, 2001, now U.S. Pat. No. 6,705,331.

BACKGROUND OF THE INVENTION

1. Field of the Invention

The present invention relates to an apparatus for applying cleaning process to various substrates such as a semiconductor wafer, a glass substrate for a liquid crystal display, a PDP (Plasma Display Panel) substrate or a glass substrate and a ceramic substrate for magnetic discs.

2. Description of the Background Art

A process of manufacturing semiconductor devices includes a step of forming a thin film on a semiconductor wafer (hereinafter referred to as "substrate") and then selectively removing the thin film through etching process, which is repeated to obtain fine patterns on the substrate. Respective surfaces of the substrate, in particular, the major surface of the substrate on which thin films are to be formed, should be clean to precisely obtain the fine patterns on the substrate. Accordingly, a step of cleaning the substrate is conducted as required.

In a conventional substrate cleaning apparatus, a droplet-injection cleaning system, which uses a cleaning double fluids nozzle for strongly removing contaminants adhering the surface of the substrate, has been proposed.

Figure 6:
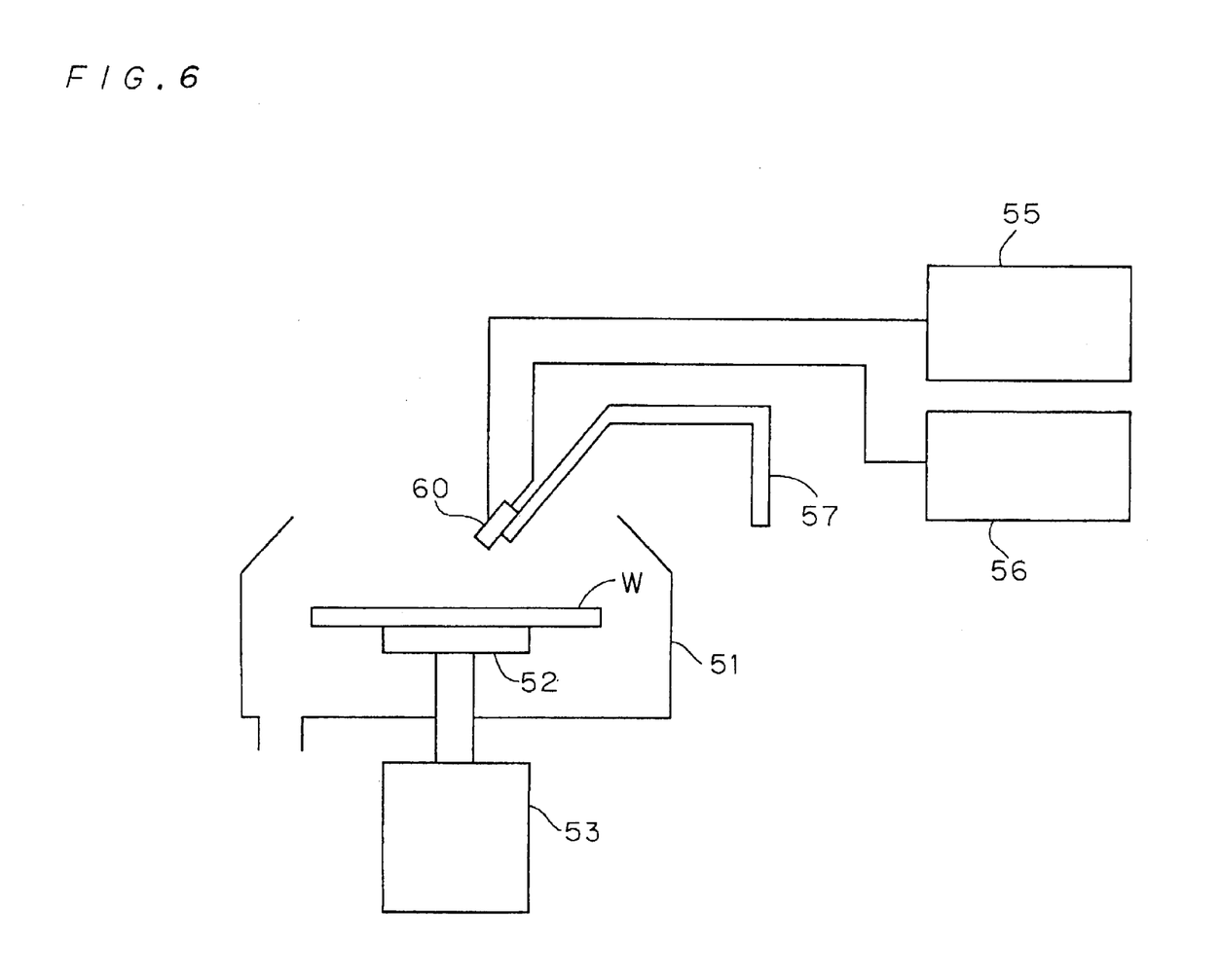
FIG. 6 is an explanatory drawing that shows a conventional cleaning apparatus.

FIG. 6 is a schematic drawing of a cleaning apparatus in which the conventional cleaning double fluids nozzle is used. This cleaning apparatus is provided with a cleaning cup 51, a spin chuck 52 for holding a substrate W inside the cleaning cup 51, an electric motor 53 for rotating this spin chuck 52, a gas supplying means 55 for supplying pressurized gas to the cleaning double fluids nozzle 60 for discharging droplets onto the surface of the substrate W, and a liquid supplying means 56 for supplying a pressurized liquid to the cleaning double fluids nozzle 60. Moreover, a robot arm 57 for holding and shifting the cleaning double fluids nozzle 60 is installed.

Figure 7:
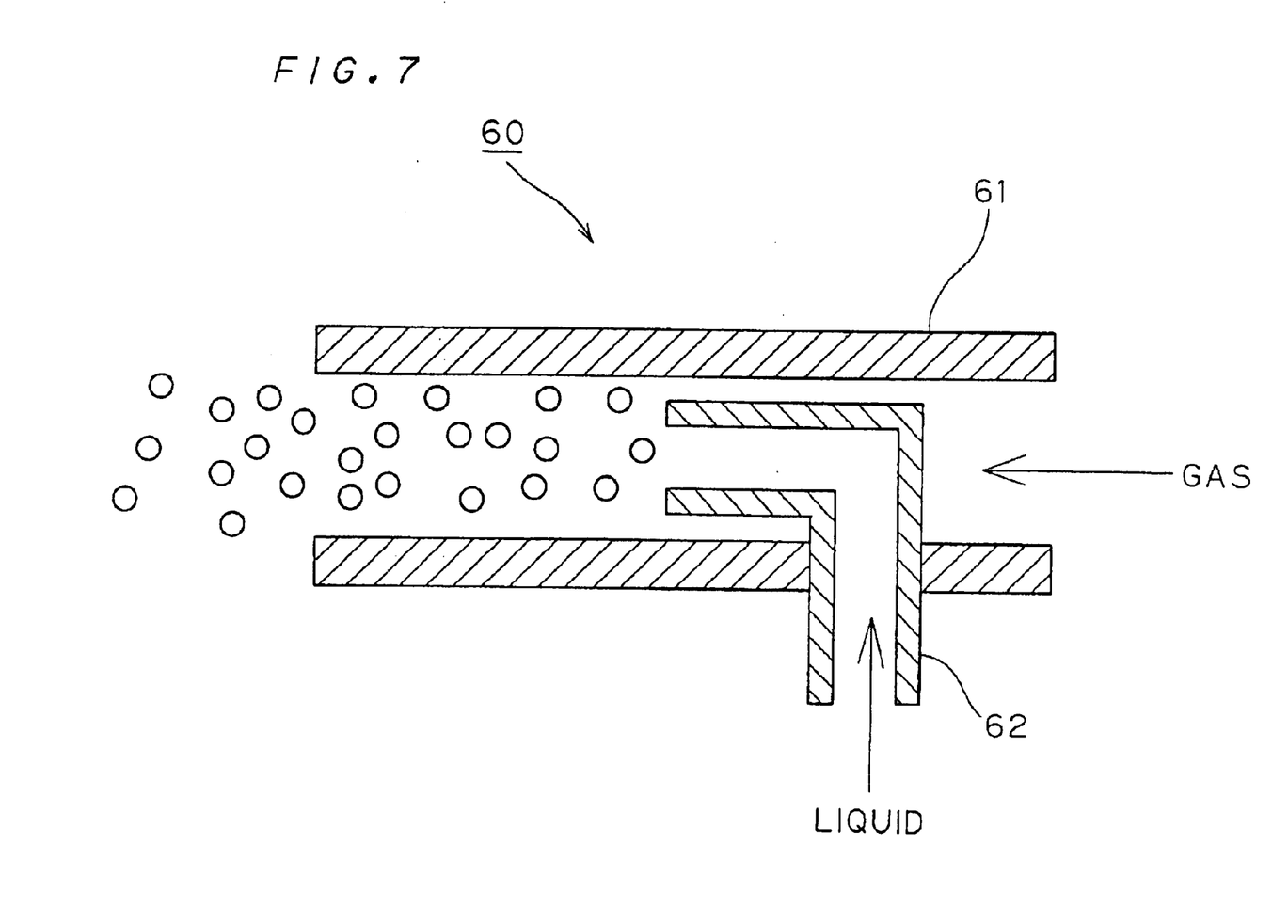
FIG. 7 is an explanatory drawing that shows a conventional cleaning nozzle.

FIG. 7 shows a cross-sectional view of the conventional cleaning double fluids nozzle 60. The cleaning double fluids nozzle is provided with a first tube path 61 through which gas is transmitted, and a second tube path 62 the tip of which is allowed to penetrate the side wall of the first tube path 61 from the outside of the first tube path 61, and extended to the inside of the first tube path 61 and through which a fluid is transmitted. The tip of the second tube path 62 is extended in the same direction as the direction in which the first tube path 61 is extended.

A substrate W is fixed to the spin chuck 52, and rotated at a predetermined number of revolutions. Pressurized gas is supplied from a gas supplying means 55 to the cleaning double fluids nozzle 60, and a pressurized liquid is supplied from a liquid supplying means 56 thereto, respectively. In the cleaning double fluids nozzle 60, the gas and the liquid are mixed with each other so that the liquid is changed to droplets in the form of mist. These droplets are accelerated by the gas flow inside the first tube path 61, and discharged from the tip of the first tube path 61. The atomized droplets thus discharged are made to collide with the surface of the substrate W, thereby removing the contaminants adhering to the surface of the substrate W.

However, in the above-mentioned cleaning apparatus, the gas and the liquid are mixed inside the cleaning double fluids nozzle 60. Therefore, when the flow rate of one fluid is attempted to be changed independently of the flow rate of the other fluid, the latter is also changed since the respective pressures interfere with each other inside the first tube path 61.

In other words, in the case when the gas flow rate is increased so as to increase the cleaning strength, since the pressure of the gas inside the first tube path 61 increases so that the flow rate of the liquid supplied from the second tube path 62 is suppressed. Consequently, the droplets to be discharged from the tip opening of the nozzle of the double fluids nozzle 60 tend to have cleaning strength different from the initial cleaning strength due to the suppressed liquid flow rate.

Consequently, fine particles such as dusts and slurries tend to remain on the surface of the substrate W, resulting in a serious problem of a reduced yield in the manufacturing process of the semiconductor device.

Moreover, in the above-mentioned cleaning apparatus, since the gas and the liquid are mixed inside the cleaning double fluids nozzle 60, dusts are generated because irregularities on the inner wall of the nozzle 60 are cut. The dusts may be also generated during the mixing operation. The substances resulting from the dried liquid and adhering to the inside of the nozzle 60 are taken off by the flow in the nozzle.

SUMMARY OF THE INVENTION

The present invention is directed to an apparatus for removing pollution from a substrate.

According to the present invention, the apparatus comprises: a) a liquid discharging mechanism for discharging liquid into an open space; and b) a gas discharging mechanism for discharging gas in a vicinity of the liquid in the open space to convert the liquid into liquid droplets and generate mixture of the gas and the liquid droplets, the mixture of the gas and the liquid droplets being applied to a surface of a substrate to clean the surface of the substrate.

In an aspect of the present invention, the liquid and the gas are collided with each other in the open space to obtain the mixture of the gas and the liquid droplets.

Preferably, the mixture is obtained by discharging one of the liquid and the gas into a jet flow of the other of the liquid and the gas.

In a preferred embodiment of the present invention, the liquid discharging mechanism has a liquid outlet through which the liquid is discharged, the gas discharging mechanism has a gas outlet through which the gas is discharged, and an angle between a center axis line of the liquid outlet and a center axis line of the gas outlet is not less than 0 degrees and not more than 110 degrees.

In an another aspect of the present invention, an apparatus for removing pollution from a substrate comprising: a) first and second supply paths for supplying liquid and gas, respectively; and b) a nozzle coupled to the first and second supply paths for mixing the liquid with the gas to obtain a cleaning fluid and applying the cleaning fluid onto a surface to the substrate, comprising b-1) a liquid outlet through which the liquid is discharged in an open space, and b-2) a gas outlet through which the gas is discharged into the liquid in the open space to convert the liquid into liquid droplets, the cleaning fluid being mixture of the gas and the liquid droplets in the space.

In another aspect of the present invention, an apparatus for removing pollution from a substrate, the apparatus comprising: a) first and second supply paths for supplying liquid and gas, respectively; and b) a nozzle structure, comprising: b-1) a liquid nozzle for receiving the liquid to discharge liquid flow into an open space; and b-2) a member surrounding the liquid nozzle such that a gas passage through which the gas passes is defined between the member and the fluid nozzle, gas flow being discharged through the gas passage in a direction converging at a portion defined in the open space, wherein the liquid flow is exposed to the gas flow in the open space to obtain gas-liquid mixture to be applied to the substrate.

Accordingly, an object of the present invention is to effectively remove fine particles from the surface of the substrate.

Another object of the present invention is to clean the substrate.

Still another objective of the present invention is to improve the structure of a nozzle for discharging cleaning fluid.

These and other objects, features, aspects, and advantages of the present invention will becomes more apparent from the following detailed description of the present invention when taken in conjunction with the accompanying drawings.

DESCRIPTION OF THE PREFERRED EMBODIMENTS

<First Preferred Embodiment>

Figure 1:
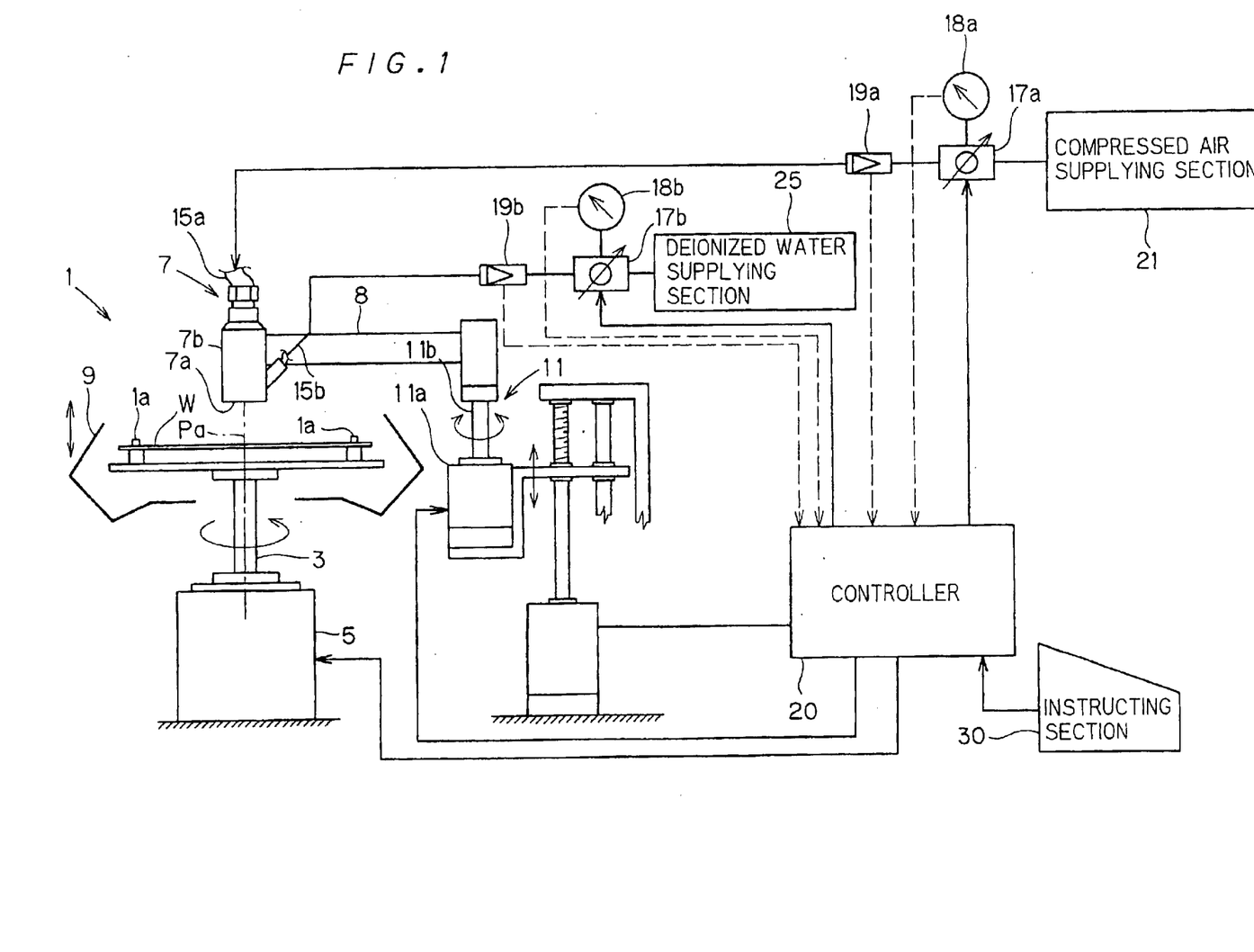
FIG. 1 is a drawing that shows a schematic construction of a substrate cleaning apparatus in accordance with preferred embodiments of the present invention.
Figure 2:
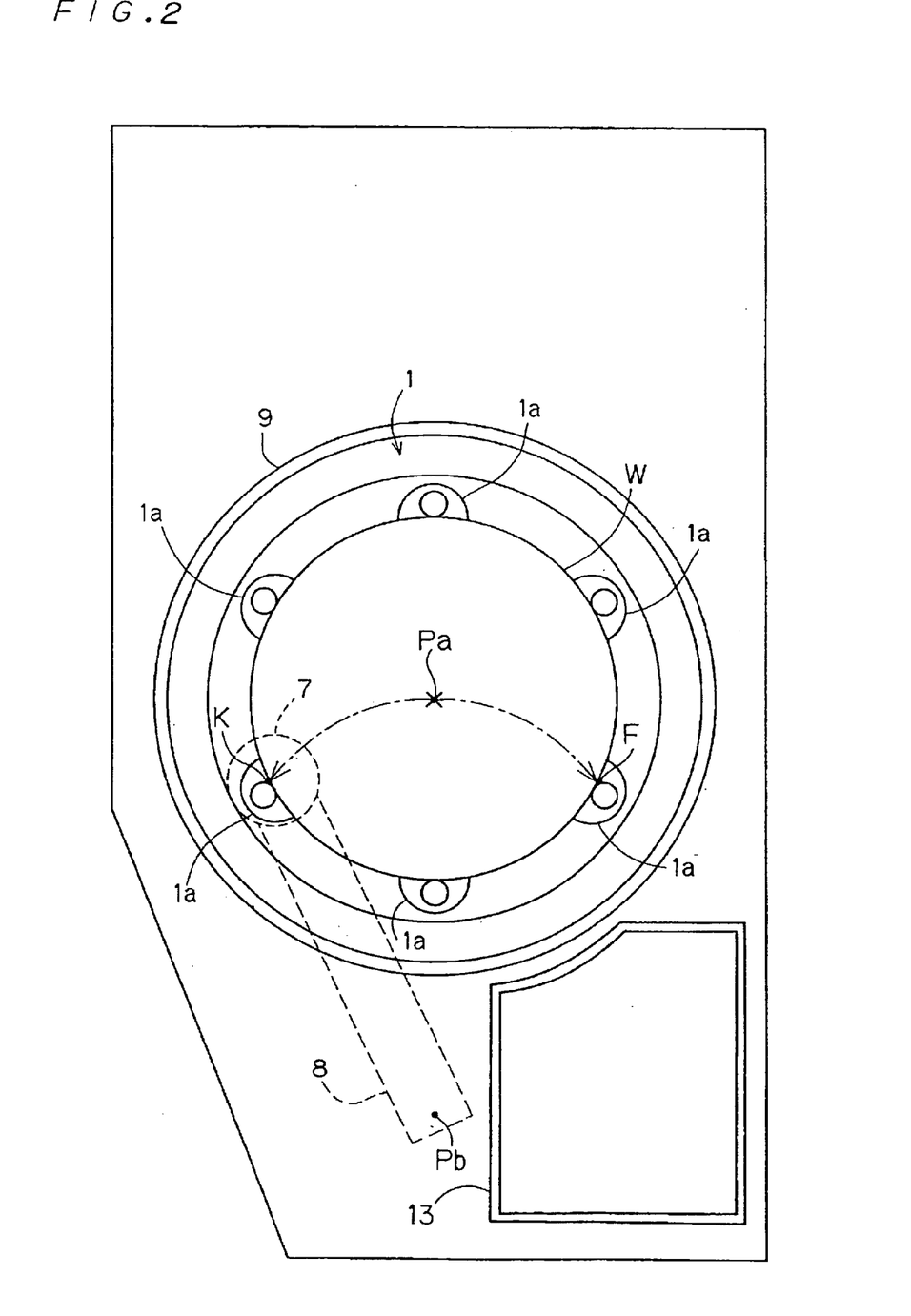
FIG. 2 is a plan view of the substrate cleaning apparatus.

FIG. 1 is a block diagram that shows a schematic construction of a substrate cleaning apparatus in accordance with a first preferred embodiment of the present invention, and FIG. 2 is a plan view thereof.

The apparatus comprises a disc-shaped spin chuck 1, and six support pins 1a are attached to the spin chuck 1 in a protruding manner. As illustrated in FIG. 1, the spin chuck 1 is allowed to rotate by an electric motor 5 through a rotary shaft 3 connected to the bottom surface thereof. A substrate W, which is supported by the support pins 1a contacting the circumferential edge thereof, is rotated within a horizontal plane around the rotation center Pa by this rotative driving operation. A scattering preventive cup 9 for preventing the scattering of a cleaning liquid M discharged from a double fluids cleaning nozzle 7 is placed on the periphery of the spin chuck 1. The cleaning liquid may be remover liquid for removing residual pollution from the surface of the substrate. This scattering preventive cup 9 is designed to be raised and lowered with respect to the spin chuck 1 as indicated by arrow shown in the Figure at the time when an uncleaned substrate W is placed on the spin chuck 1 or when a transport means, not shown, receives a cleaned substrate W from the spin chuck 1.

As illustrated in FIG. 1, the cleaning nozzle 7 is supported with its trunk portion 7b connected to the tip of a support arm 8 so that its discharging surface 7a is directed to the surface of the substrate W. The base portion of the support arm 8 is, on the other hand, connected to a raising and shifting mechanism 11. As illustrated in FIG. 2, the cleaning nozzle 7 is directed to a supply finish position F through the rotation center Pa from the supply start position K of the cleaning liquid within the in-plane of the substrate W. Moreover, a rotary shaft 11b of a rotary motor 11a is connected to the support arm 8. This is used for rocking the cleaning nozzle 7 around the rotation center Pb of the rotary motor 11a on the substrate W.

The cleaning nozzle 7 constitutes two fluids nozzle in which a pipe 15a for introducing compressed air into its trunk portion 7b as gas and a pipe 15d for introducing deionized water as liquid are connected and allowed to communicate with each other. The pipe 15a is connected to a compressed air supplying section 21 corresponding to a gas supplying means of the present invention on the upstream side thereof. The pipe 15a is provided with an electropneumatic regulator 17a for adjusting the pressure of transmitted air to a pressure corresponding to a control signal inputted from a controller 20, a pressure sensor 18a for detecting the pressure of air and a flow-rate sensor 19a for detecting the flow rate.

The pipe 15b is provided with an electropneumatic regulator 17b for adjusting the pressure of transmitted deionized water to a pressure corresponding to a control signal inputted from the controller 20, a pressure sensor 18b for detecting the pressure of air and a flow-rate sensor 19b for detecting the flow rate. The liquid to be used is not limited to deionized water, and, for example, extra-pure water (extra-deionized water) may be used. Moreover, any one of chemical liquids (for example, hydrofluoric acid, sulfuric acid, hydrochloric acid, nitric acid, phosphoric acid, acetic acid, ammonia or a hydrogen peroxide water liquid of these) may be used.

Control signals from the controller 20 are respectively inputted to the electropneumatic regulators 17a, 17b, and in accordance with these control signals, the pressures of the gas and deionized water transmitted through the pipes 15a, 15b are adjusted. The results of detection, successively detected by the pressure sensors 18a, 18b and the flow-rate sensors 19a, 19b, are fed back to the controller 20.

To the controller 20 are respectively connected the electric motor 5, the raising and shifting mechanism 11, the electropneumatic regulators 17a, 17b, the pressure sensors 18a, 18b and the flow-rate sensors 19a, 19b. Cleaning conditions for each substrate W are preliminarily stored in the controller 20 as a cleaning program (also referred to as "recipe"), and the above-mentioned respective sections are controlled in accordance with the cleaning program for each substrate W.

An instructing section 30, which is used for forming and altering the cleaning programs and for selecting a desired one of a plurality of cleaning programs, is connected to the controller 20.

Figure 3:
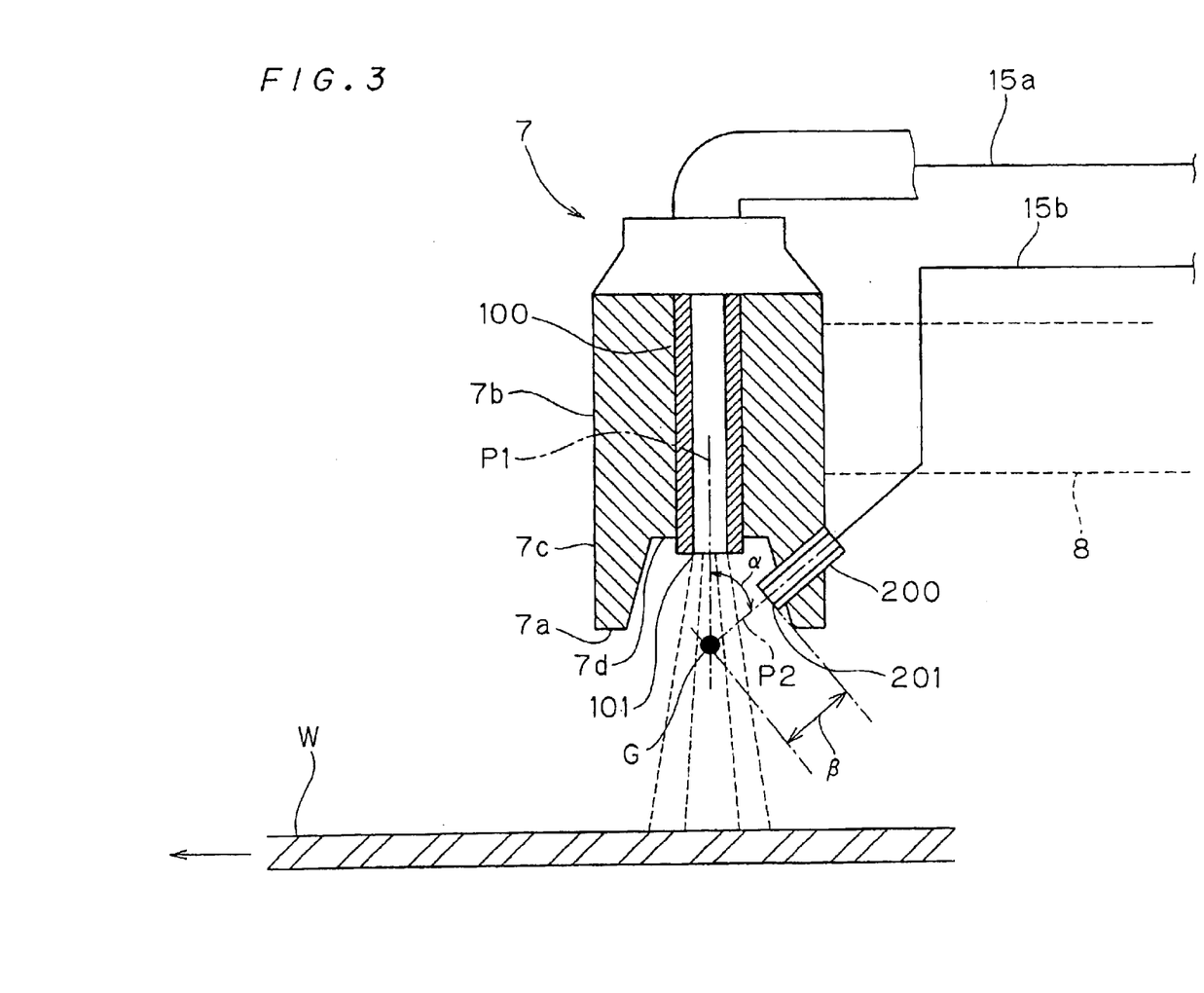
FIG. 3 is a longitudinal cross-sectional view that shows a structure of a cleaning nozzle in accordance with a first preferred embodiment of the present invention.

Next, referring to Figures, a detailed explanation will be given of the inner structure of the cleaning nozzle 7 that is the featured construction of the present preferred embodiment. FIG. 3 is a cross-sectional side view taken from the apparatus side, which schematically shows the structure of the cleaning nozzle 7.

In this structure, the trunk portion 7b is secured to one end of the support arm 8 with bolts, etc., and placed with a gas discharging nozzle 100 having a gas discharging outlet 101 and a liquid discharging nozzle 200 having a liquid discharging outlet 201 being inserted through the inside of the trunk portion 7b. The gas discharging nozzle 100 and the liquid discharging nozzle 200 are connected to the compressed air supplying section 21 and the deionized water supplying section 25 through the pipes 15a, 15b that pass through the inside of the support arm 8.

The gas discharging nozzle 100, which is placed in a manner so as to allow its gas discharging outlet 101 to face the surface of the substrate W, is arranged so that its center axis line P1 passing through the gas discharging outlet 101 is allowed to vertically cross the surface of the substrate W. The liquid discharging nozzle 200 is, on the other hand, placed in a manner so as to diagonally tilt in the vicinity of the gas discharging nozzle 100, and arranged so that its center axis line P2 passing through the liquid discharging outlet 201 is allowed to diagonally cross the surface of the substrate W. The crossing point at which the center axis lines P1, P2 intersect each other is a collision portion G that is a mixing area of the liquid and gas. This mixing area of the liquid and the gas is within the open space.

The trunk portion 7b of the cleaning nozzle 7 has a column shape with its outer circumferential edge of the discharging surface 7a forming a beveled portion 7c sticking downward. The gas discharging nozzle 100 is arranged so that the gas discharging outlet 101 is placed on the upper surface portion 7d of the beveled portion 7c, and the liquid discharging nozzle 200 is arranged so that the liquid discharging outlet 201 is placed in the mid point of the beveled portion 7c. Additionally, the trunk portion 7b is integrally formed by a fluoro-resin such as Teflon.

In obtaining atomized cleaning liquid by using the cleaning nozzle 7, the incident angle α of each of the center axis lines P1, P2 in the collision portion G is preferably set in the range of not less than 0 degree to not more than 110 degrees, although it slightly changes depending on the flow rate and flow velocity of each fluid. In this case, when the respective incident angles α are set to 0 degree, the discharging directions of air and deionized water are in parallel with each other, however, by discharging one of the discharged flows into the jet flow of the other, it is possible to form droplets or mist. With respect to its aspect, a detailed explanation will be given later in a second preferred embodiment. However, in the case when the incident angle α is greater than 110 degrees, the collision between deionized water and air virtually becomes a frontal collision, and consequently, it is confirmed that the droplets are scattered not in one direction, but in all the directions. In other words, the droplets that are directed to the surface of the substrate so as to clean the surface of the substrate W come to decrease in number, failing to carry out a good cleaning operation. Therefore, the incident angle α is preferably set in the range of not less than 0 degree to not more than 110 degrees so that it becomes possible to direct the atomized cleaning liquid in one direction.

Moreover, with respect to the distance β from the liquid discharging outlet 201 to the collision portion G is preferably set in the range from greater than 0 mm to not more than 20 mm as a distance that does not allow the pressure of the liquid discharged flow to attenuate to cause the flow to collapse.

Moreover, the collision portion G is set at the same position as the discharging surface 7a of the cleaning nozzle 7 or at a position slightly closer to the surface side of the substrate W. With this arrangement, the beveled portion 7c is allowed to prevent external influences at the collision portion G, thereby making it possible to properly mix deionized water and air. Since the collision portion G is not close to the upper surface portion 7d, it is possible to prevent the atomized droplets from adhering to the inner surface of the beveled portion 7c and dropping therefrom. The distance between the collision portion G and the surface of the substrate W is preferably set in accordance with a desired cleaning capability, and it is set to not more than 100 mm, preferably, approximately in the range of 3 to 30 mm.

In the above-mentioned arrangement, when the electropneumatic regulators 17a, 17b are released by signals from the controller 20 so that air and deionized water are supplied from the gas discharging outlet 101 and the liquid discharging outlet 201, the deionized water is mixed into the discharged flow or jet of air thus injected into the open space around the portion G so as to allow the discharged flow structure to collapse, thereby accelerating the formation of the droplets. This atomized cleaning liquid makes it possible to clean the surface of the substrate W.

Next, an explanation will be given of the cleaning operation carried out by the substrate cleaning apparatus having the above-mentioned structure.

First, a predetermined cleaning program corresponding to the substrate W is selected by the instructing section 30, and executed. Then, the scattering preventive cup 9 is lowered with respect to the spin chuck 1, and a substrate W is carried into the substrate cleaning apparatus by a hand of a substrate transporting robot with the cleaning nozzle 7 being located at a stand-by position. Thus, it is placed on the upper surface of the spin chuck 1, and held thereon. Further, the scattering preventive cup 9 is raised, while the cleaning nozzle 7 is shifted to a cleaning start position. Next, the spin chuck 1 holding the substrate W is rotated, thereby allowing the substrate W to rotate in the rotation direction, centered on the rotation center Pa (substrate rotating step).

Next, as illustrated in FIG. 2, with the substrate W being rotated at a fixed low speed, the cleaning nozzle 7 is allowed to shift from the supply start position K of the cleaning liquid to the supply end position F passing through the rotation center Pa (cleaning liquid supplying step). Moreover, the rotation speed of the spin chuck 1 is preferably set in the range of 10 rpm to 1000 rpm.

At this time, control signals are sent from the controller 20 to the respective electropneumatic regulators 17a, 17b so that the pressures of air and deionized water are properly adjusted so as to form droplets at the collision portion G. Simultaneously, the results of the detections made by the pressure sensors 18a, 18b and the flow-rate sensors 19a, 19b, are successively fed back to the controller 20. In other words, the air supplied by the compressed air supplying section 21 is transported through the pipe 15a, and the deionized water supplied by the deionized water supplying section 25 is simultaneously transported to the pipe 15b.

At this time, air is discharged from the gas discharging outlet 101 of the cleaning nozzle 7, and after a lapse of first predetermined time, deionized water is supplied from the liquid discharging outlet 201. With this arrangement, the deionized water supplied to the collision portion G is allowed to form droplets, and simultaneously mixed with supplied air. Consequently, the deionized water collides with air to be atomized immediately after it has been discharged. Thus, it is possible to eliminate the wasteful use thereof in the case when it is discharged onto the surface of the substrate W as the liquid flow. These droplets or mist, as they are, are directly supplied onto the substrate W.

The discharging speed of the atomized cleaning liquid is properly set by adjusting the flow rates and flow velocities of the deionized water and the air that are maintained in a mutually independent state. In this controlling operation, the air and deionized water do not interfere with each other, and therefore, desired droplets or mist are obtained by desirably controlling the flow rate and flow velocity of the liquid or the gas. Thus, it becomes possible to remove fine particles on the substrate sufficiently.

Next, the rotation of the substrate W driven by the spin chuck 1 is stopped. Lastly, when the cleaning nozzle 7 has arrived at the supply end position F, control signals are sent from the controller 20 to the electropneumatic regulators 17a, 17b so that the supplies of the respective objects are stopped, and the cleaning nozzle 7 is shifted to the stand-by position 13. At the time of the stoppage of the cleaning operation, with respect to the cleaning nozzle 7, the air discharge is stopped after the deionized water discharge has been stopped. Consequently, it is possible to eliminate the wasteful use of the cleaning liquid in which after the cleaning of the surface of the substrate W by using the atomized cleaning liquid, the cleaning flow is still discharged onto the surface of the substrate W.

Then, the substrate W is rotated at a high speed to scatter the cleaning liquid adhering to the surface of the substrate W so that the spinning-off process for drying the substrate W is carried out, thereby completing the sequence of operations (drying step). Lastly, the substrate W is carried out from the spin chuck 1 by the hand of the substrate transporting robot, thereby completing the cleaning step by the substrate processing apparatus on the substrate W. Then, the substrate W is inserted in a cassette capable of housing a plurality of substrates W.

As described above, in accordance with the present invention, the surface of the substrate is cleaned by using the mist of the cleaning liquid formed by atomizing the liquid with gas in the air. At this time, the atomized cleaning liquid is generated after the gas and liquid have been discharged from the gas discharging means and the liquid discharging means. For this reason, the flow rates and flow velocities of the liquid and gas are maintained in a mutually independent state. Then, the discharged liquid and gas are mixed in the air, and allowed to form an atomized state. Consequently, a desired flow of droplets or mist current is obtained without making the respective flows interfere with each other upon forming the atomized cleaning liquid. Therefore, it is possible to sufficiently remove fine particles on the surface of the substrate, and consequently to improve the cleaning power exerted on the surface of the substrate.

In the above-mentioned embodiments, the center axis P1 passing through the gas discharging outlet 101 of the cleaning nozzle 7 is directed perpendicularly to the surface of the substrate W. However, this may be directed diagonally to the surface thereof.

The mixing operation of a liquid and gas can be attained with another structure described bellow:

<Second Preferred Embodiment>

Figure 4:
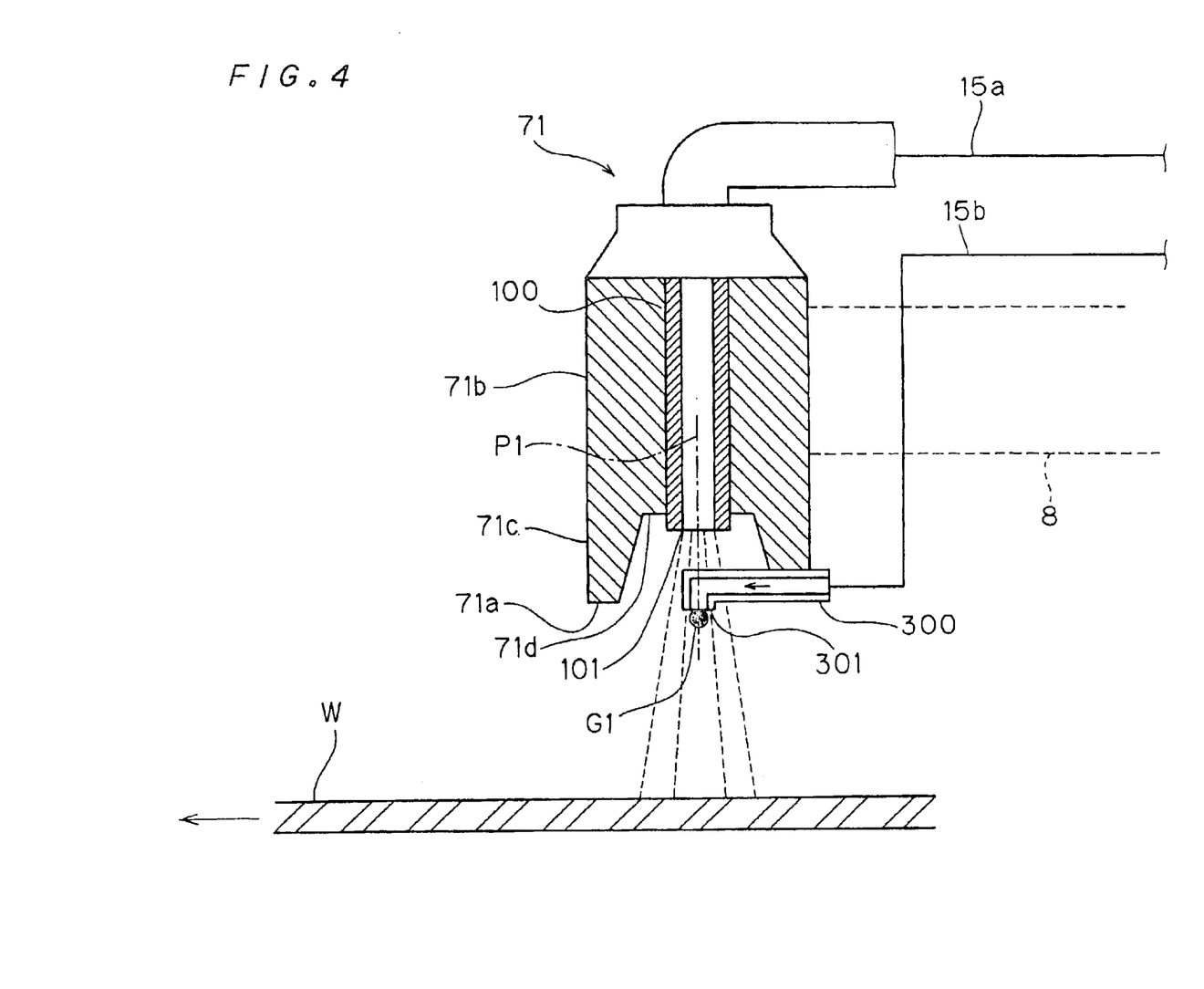
FIG. 4 is a longitudinal cross-sectional view that shows a structure of a cleaning nozzle in accordance with a second preferred embodiment of the present invention.

FIG. 4 is a cross-sectional view taken from the apparatus side that shows another schematic construction of a cleaning nozzle in accordance with a second preferred embodiment of the present invention. Here, with respect to members that are the same as those of the first preferred embodiment, they are indicated by the same reference numerals, and the description thereof is omitted. The remaining construction of the cleaning apparatus in which the cleaning nozzle according to the second preferred embodiment is similar to that of the first preferred embodiment. A cleaning nozzle 71 has a trunk portion 71b through which a gas discharging nozzle 100 having a gas discharging outlet 101 is inserted. Then, a gas discharging outlet 101 is formed in the upper surface portion 71d of a beveled portion 71c of the cleaning nozzle 71. A liquid outlet nozzle 300 is placed on the lower end of the bevel portion 71c.

The liquid discharging nozzle 300 is arranged in parallel with the discharging surface 7a with its tip being extended in a discharged flow of air below the gas discharging outlet 101. The tip portion is bent downward so as to allow the liquid discharging outlet 301 to face the surface of the substrate W. Moreover, the center axis line P1 passing through the gas discharging outlet 101 perpendicularly crosses the surface of the substrate W, and is also coincident with the center axis line passing through the liquid discharging outlet 301. Thus, the discharged deionized water is smoothly formed into droplets by a discharged flow of air on the periphery thereof, in the proximity of the liquid discharging outlet 301 in the discharging direction. Therefore, the position G1 in the FIG. 4 is a collision portion defined in a open space that is a mixing area between the liquid and the gas. In other words, in the second preferred embodiment, an arrangement is made so that the incident angles of the center axis line P1 and the center axis line passing through the liquid discharging outlet 301 are set to 0 degree.

As described above, in the second preferred embodiment, droplets are smoothly generated by discharging deionized water into the discharged flow of air. Moreover, since the droplets or mist are formed in the discharged flow, the arrangement is less susceptible to scattering of the droplets, and consequently has a superior cleaning effect. Here, in the second preferred embodiment, any arrangement may be adopted as long as, into one of the discharged flows, the other is discharged, and the center axes of the liquid discharging outlet 301 and the gas discharging outlet 101 are not necessarily coincident with each other. In other words, the discharging outlet within the discharged flow may be slightly tilted as long as, into one of the discharged flows, the other is discharged.

<Third Preferred Embodiment>

Figure 5:
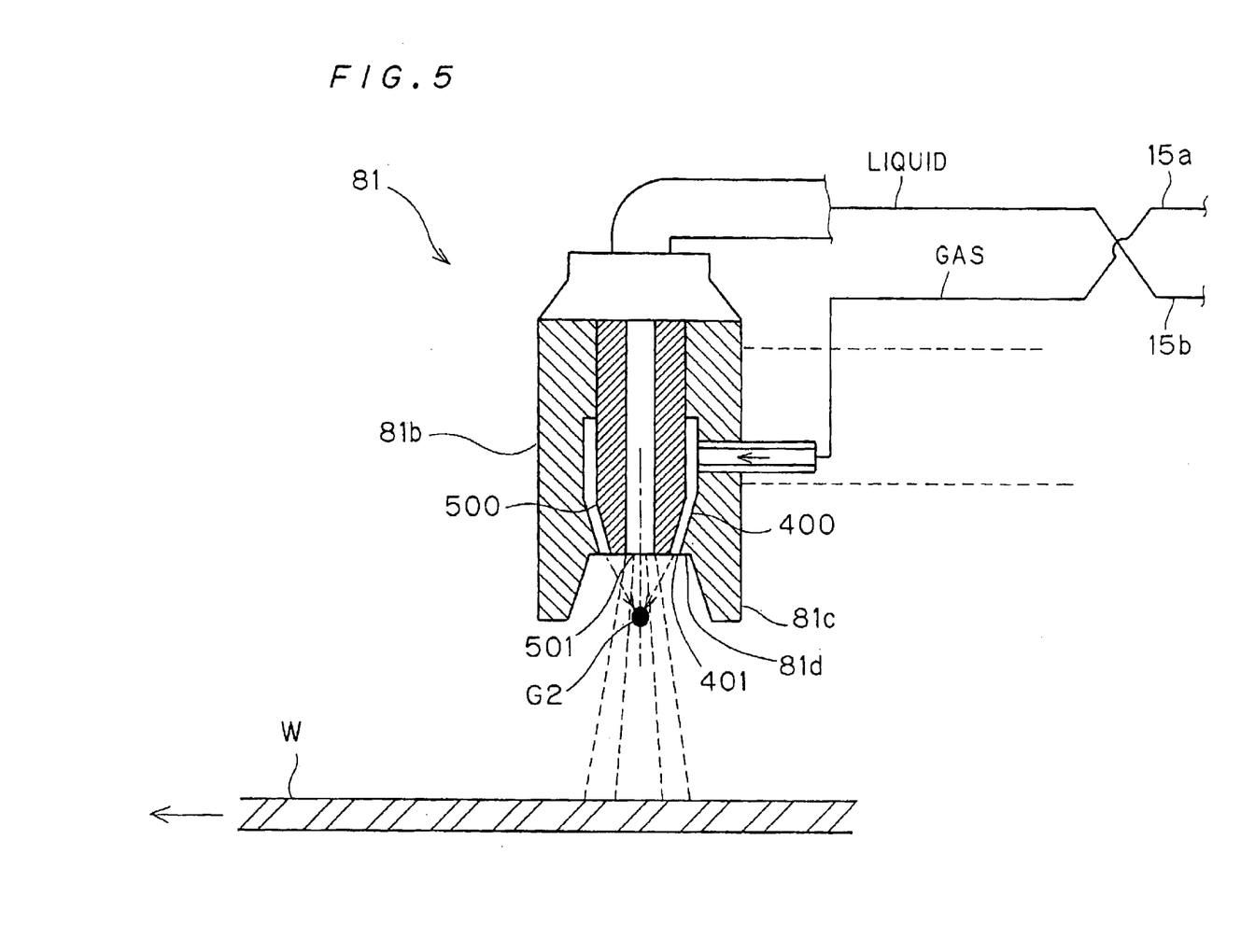
FIG. 5 is a longitudinal cross-sectional view that shows a structure of a cleaning nozzle in accordance with a third preferred embodiment of the present invention.

FIG. 5 is a cross-sectional view taken from the apparatus side that shows another schematic construction of a cleaning nozzle in accordance with a third preferred embodiment of the present invention. Here, with respect to members that are the same as those of the first preferred embodiment, they are indicated by the same reference numerals, and the description thereof is omitted. The remaining construction of the cleaning apparatus in which the cleaning nozzle according to the third preferred embodiment is similar to that of the first preferred embodiment.

A cleaning nozzle 81 has a trunk portion 81b through which a gas discharging nozzle 500 having a liquid discharging outlet 501 is inserted. Then, a liquid discharging outlet 501 is formed in the upper surface portion 81d of a beveled portion 81c of the cleaning nozzle 81.

The gas discharging nozzle 400 is arranged to define a ring-shaped gas passage surrounding the liquid discharging nozzle 500. The end portion of the gas discharging nozzle 400 is tapered-off toward the bottom end thereof and the nozzle opening faces to the surface of the substrate W. The outlet path of the gas from the gas discharging outlet 401 crosses the outlet path of the deionized water from the liquid discharging outlet 501. The liquid current (deionized water current) from the liquid discharging outlet 4501 collides with the gas current at the collision portion G2 defined in the mixture region. The gas flow is discharged to converge at the collision portion G2. The mixture region is an open space defined just below the lower part of the trunk portion 81b. Accordingly, the deionized water current is rapidly converted into liquid droplets by the gas colliding with the deionized water near to the direction in which the deionized water is discharged.

In the third preferred embodiment of the present invention, the gas is discharged to surround the current of deionized water discharged and the mixture of the deionized water and the gas is generated through the collision of the deionized water and the gas. The restricted area of the surface of the substrate W is cleaned by the liquid droplets which is uniformly distributed. The surface of the substrate W is scanned with the nozzle 81, so that the whole surface of the substrate W is cleaned by the mixture of the deionized water and the gas.

Further, in the third preferred embodiment, the liquid discharging outlet 501 and the gas discharging outlet 401 are not necessarily on the same plane. One of the outlets 501 and 401 may project toward the open space.

<Modifications>

The present invention may be modified as described below.

(1) In the above-mentioned preferred embodiment, air is supplied from the pipe 15a, and deionized water is supplied from the pipe 15b. However, deionized water may be supplied from the pipe 15a, and air may be supplied from the pipe 15b.

(2) Moreover, in the above-mentioned one aspect, with respect to the gas supplied from the pipe 15a, only air is use. Alternatively, a mixed gas of air and a gas that improves the cleaning degree when mixed with air may be used, or a gas that simply improves the cleaning degree, such as ozone gas, carbon dioxide or hydrogen, may be supplied therefrom.

(3) In addition to the soft-type substrate cleaning apparatus, which supplies a cleaning liquid from the cleaning nozzle 7, those of a hard type using the cleaning nozzle 7 in combination with a brush may be adopted.

(4) The cleaning nozzle 7 may be rocked only once in one direction within the plane of the substrate W on which the cleaning liquid is supplied, and alternatively, this may be rocked several times within the plane of the substrate W.

(5) With respect to the spin chuck 1, a pin-holding type spin chuck in which the substrate W is rotated with its circumferential edge held by pins from below and on its end surface may be used, and alternatively, a suction-type spin chuck holding the substrate W by sucking the lower surface thereof may be used.

(6) Furthermore, the spin chuck 1 may be prepared as at least three roller pins or the like that rotate centered on an axis in parallel with the rotation center Pa of the substrate W while contacting the circumferential end edge of the substrate W. The spin chuck using these roller pins is particularly effective in the case when both of the surfaces of the substrate W are cleaned, and in the case when the cleaning nozzles 7 are placed at positions sandwiching the substrate W, it is possible to desirably clean the entire areas of both of the surfaces of the substrate.

The present invention is widely applied to the cleaning operation for various other substrates, such as a glass substrate for a liquid crystal display, a PDP (Plasma Display Panel) substrate or a glass substrate and a ceramic substrate used for a magnetic disk. With respect to the shape of the substrate, not limited to the round substrate of the above-mentioned preferred embodiments the present invention is also applied to square-shaped substrates having a square shape or a rectangular shape.

While the invention has been shown and described in detail, the foregoing description is in all aspects illustrative and not restrictive. It is therefore understood that numerous other modifications and variations can be devised without departing from the scope of the invention.

What is claimed is:

1. An apparatus for removing pollution from a substrate, said apparatus comprising:

a) a rotation mechanism for rotating said substrate in a horizontal plane;

b) an injection mechanism, comprising b-1) a liquid discharging mechanism for discharging liquid into an open space, and b-2) a gas discharging mechanism for discharging gas in a vicinity of said liquid in said open space to convert said liquid into liquid droplets and generate mixture of said gas and said liquid droplets, said mixture of said gas and said liquid droplets being applied to a surface of said substrate to clean said surface of said substrate, c) a support member for supporting said injection mechanism in such a way that said injection mechanism is capable of injecting said mixture toward said surface of said substrate; and d) a moving mechanism for shifting said support member from a standby position to a cleaning start position of said substrate.

2. The apparatus in accordance with claim 1, wherein said liquid and said gas are collided with each other in said open space to obtain said mixture of said gas and said liquid droplets.

3. The apparatus m accordance with claim 1, wherein said mixture is obtained by discharging one of said liquid and said gas into a jet flow of the other of said liquid and said gas.

4. The apparatus m accordance with claim 1, wherein said liquid discharging mechanism has a liquid outlet through which said liquid is discharged, said gas discharging mechanism has a gas outlet through which said gas is discharged, and an angle between a center axis line of said liquid outlet and a center axis line of said gas outlet is not less than 0 degrees and not more than 110 degrees.

5. An apparatus for removing pollution from a substrate, said apparatus comprising:

a) a rotation mechanism for rotating said substrate in a horizontal plane;

b) first and second supply paths for supplying liquid and gas, respectively;

c) a nozzle coupled to said first and second supply paths for mixing said liquid with said gas to obtain a cleaning fluid and applying said cleaning fluid onto a surface to said substrate, comprising c-1) a liquid outlet through which said liquid is discharged in an open space, and c-2) a gas outlet through which said gas is discharged into said liquid in said open space to convert said liquid into liquid droplets, said cleaning fluid being mixture of said gas and said liquid droplets in said space, d) a support member for supporting said nozzle; and e) a moving mechanism for shifting said nozzle from a standby position to a cleanina start position of said substrate.

6. The apparatus in accordance with claim 5, wherein said liquid and said gas are collided with each other in said open space to obtain said mixture of said gas and said liquid droplets.

7. The apparatus in accordance with claim 5, wherein said mixture is obtained by discharging one of said liquid and said gas into a jet flow of the other of said liquid and said gas.

8. The apparatus in accordance with claim 5, wherein an angle between a center axis line of said liquid outlet and a center axis line of said gas outlet is not less than 0 degrees and not more than 110 degrees.

9. The apparatus in accordance with claim 5, further comprising:
   f) a controller for controlling said first and second supply paths to start supply of said liquid after supply of said gas is started.

10. The apparatus in accordance with claim 9, wherein said controller is operable to control said first and second supply paths to stop supply of said liquid after supply of said gas is stopped.

11. An anparatus for removing pollution from a substrate, said apparatus comprising:
   a) a rotation mechanism for rotating said substrate in a horizontal plane;
   b) an injection mechanism; comprising
   b-1) a liquid discharging mechanism for discharging liquid into an open space, and
   b-2) a gas discharging mechanism for discharging gas in a vicinity of said liquid in said open space to convert said liquid into liquid droplets and generate mixture of said gas and said liquid droplets.
   said mixture of said gas and said liquid droplets being applied to a surface of said substrate from a position opposite to said surface of said substrate, to clean said surface of said substrate, and
   c) a support member for supporting said injection mechanism in such a way that said injection mechanism is capable of injecting said mixture toward said surface of said substrate.

12. The apparatus in accordance with claim 11, wherein said liquid and said gas are collided with each other in said open space to obtain said mixture of said gas and said liquid droplets.

13. The apparatus in accordance with claim 11, wherein said mixture is obtained by discharaing one of said liquid and said gas into a jet flow of the other of said liquid and said gas.

14. The apparatus in accordance with claim 11, wherein said liquid discharging mechanism has a liquid outlet through which said liquid is discharged,
   said gas discharging mechanism has a gas outlet through which said gas is discharged, and
   an angle between a center axis line of said liquid outlet and a center axis line of said gas outlet is not less than 0 degrees and not more than 110 degrees.

\* \* \* \* \*